United States Patent
Wada

(10) Patent No.: US 12,230,710 B2
(45) Date of Patent: Feb. 18, 2025

(54) LDMOS WITH FIELD PLATES

(71) Applicant: ABLIC Inc., Tokyo (JP)

(72) Inventor: Shinichirou Wada, Tokyo (JP)

(73) Assignee: ABLIC Inc., Tokyo (JP)

( * ) Notice: Subject to any disclaimer, the term of this patent is extended or adjusted under 35 U.S.C. 154(b) by 684 days.

(21) Appl. No.: 17/312,663

(22) PCT Filed: Oct. 11, 2019

(86) PCT No.: PCT/JP2019/040216
§ 371 (c)(1),
(2) Date: Jun. 10, 2021

(87) PCT Pub. No.: WO2020/129375
PCT Pub. Date: Jun. 25, 2020

(65) Prior Publication Data
US 2022/0052197 A1    Feb. 17, 2022

(30) Foreign Application Priority Data

Dec. 19, 2018   (JP) ................................ 2018-237115

(51) Int. Cl.
*H01L 21/00*  (2006.01)
*H01L 29/08*  (2006.01)
(Continued)

(52) U.S. Cl.
CPC ...... *H01L 29/7835* (2013.01); *H01L 29/0847* (2013.01); *H01L 29/1095* (2013.01);
(Continued)

(58) Field of Classification Search
CPC ............. H01L 29/7835; H01L 29/0847; H01L 29/1095; H01L 29/36; H01L 29/404; H01L 29/7816
See application file for complete search history.

(56) References Cited

U.S. PATENT DOCUMENTS 5,374,843 A     12/1994  Williams et al.
2002/0145172 A1  10/2002  Fujishima et al.
(Continued)

FOREIGN PATENT DOCUMENTS

JP    H07-050413 A    2/1995
JP    2002-270830 A   9/2002
(Continued)

OTHER PUBLICATIONS

Supplementary European Search Report, dated Aug. 18, 2022, pp. 1-11, issued in European Patent Application No. 19897840.5, European Patent Office Munich, Germany.
(Continued)

*Primary Examiner* — Richard A Booth
(74) *Attorney, Agent, or Firm* — Crowell & Moring LLP

(57) ABSTRACT

There is provided a high withstand voltage LDMOS field-effect transistor that enables the compatibility of an increase of its withstand voltage and a decrease of its ON resistance. The high withstand voltage LDMOS is characterizing in including: a first electroconductive type body region formed on a main surface of a semiconductor substrate; a second electroconductive type source region formed on a surface of the body region; a second electroconductive type drift region formed so as to have contact with the body region; a second electroconductive type drain region formed on the drift region; a first electroconductive type buried region having contact with the body region and formed below the drift region; a gate electrode formed above the body region between the source region and the drift region and above the drift region nearer to the source region via a gate insulating film; a first field plate that extends from the gate electrode toward the drain region and that is formed above the drift region via a first insulating film; and a second field plate that has contact with the source region or the gate electrode and (Continued)

that is formed above the first field plate via a second insulating film, in which a distance between the buried region and the drain region is smaller than a distance between the first field plate and the drain region and larger than a distance between the second field plate and the drain region.

10 Claims, 10 Drawing Sheets

(51) Int. Cl.
*H01L 29/10* (2006.01)
*H01L 29/36* (2006.01)
*H01L 29/40* (2006.01)
*H01L 29/78* (2006.01)

(52) U.S. Cl.
CPC ............ *H01L 29/36* (2013.01); *H01L 29/404* (2013.01); *H01L 29/7816* (2013.01)

(56) References Cited

U.S. PATENT DOCUMENTS

| | | | |
|---|---|---|---|
| 2012/0273879 A1* | 11/2012 | Mallikarjunaswamy | ........................ H01L 29/161 257/E21.409 |
| 2014/0284701 A1* | 9/2014 | Korec | ................. H01L 29/8605 438/155 |
| 2016/0351708 A1 | 12/2016 | Kameoka et al. | |
| 2017/0222042 A1 | 8/2017 | Lee | |
| 2017/0294532 A1* | 10/2017 | Kudymov | ........... H01L 29/7787 |

FOREIGN PATENT DOCUMENTS

| | | |
|---|---|---|
| JP | 2014-096470 A | 5/2014 |
| JP | 2015-135950 A | 7/2015 |

OTHER PUBLICATIONS

International Preliminary Report on Patentability and Written Opinion, dated Jun. 16, 2021, pp. 1-9, issued in International Application No. PCT/JP2019/040216, The International Bureau of WIPO, Geneva, Switzerland.

Notice of Reasons for Refusal English translation only, dated Oct. 28, 2022, pp. 1-11, issued in Japanese Patent Application No. 2018-237115.

J.A. Appels, et al., "High voltage thin layer devices" (RESURF devices), 1979 International Electron Devices Meeting, IEEE, Dec. 3-5, 1979.

International Search Report, English translation, in Application No. PCT/JP2019/040216, dated Dec. 17, 2019, 2 pages.

* cited by examiner

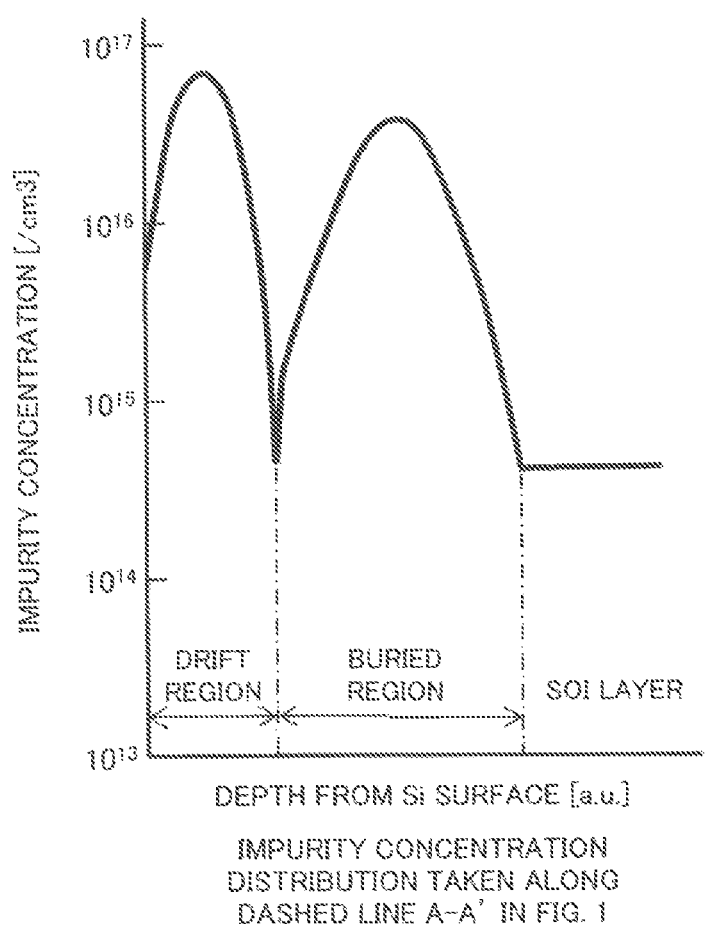

LDMOS WITH FIELD PLATES

RELATED APPLICATIONS

This application is a 371 application of PCT/2019/040216 having an international filing date of Oct. 11, 2019, which claims priority to JP2018-237115 filed Dec. 19, 2018, the entire content of each of which is incorporated herein by reference.

TECHNICAL FIELD

The present invention relates to the structure of a semiconductor device and, more particularly, relates to technologies effective in being applied to high withstand voltage LDMOSs of which a high withstand voltage equal to 100 V or larger is required.

BACKGROUND ART

LDMOS field-effect transistors (Lateral Double-diffused MOSFETs) the withstand voltages of which are 30 V or larger have been used for drive circuits having inductors such as in-vehicle solenoids and fan motors or capacitive elements such as piezoelectric elements as loads.

Although these LDMOS field-effect transistors are required to have low ON resistances for decreasing losses that occur when the LDMOS field-effect transistors are electroconductive while being required to secure high withstand voltages, there is a tradeoff relation between the withstand voltage and the ON resistance of an LDMOS field-effect transistor, so that, as the withstand voltage increases, the ON resistance increases.

As one of technologies using which the low ON resistance is gotten while the withstand voltage is being secured, a technology, which uses a RESURF (REduced SURface Field) effect disclosed in "High Voltage Thin Layer Devices (Resurf Devices)" International Electron Devices Meeting, 1979, is well known (Non-PTL 1).

The RESURF effect will be briefly explained below. A semiconductor region having the same electroconductive type as the electroconductive type of a body region is formed so that a PN junction is formed in the vertical direction to the drift region, and the semiconductor region is connected to the body region. If voltages the polarities of which are opposite to each other are applied to the body region and the drift region respectively, a depletion layer is expanded between the body region and the drift. At this time, a second depletion layer is also expanded between the semiconductor region and the drift region.

In the case where the drift region is comparatively thin, when the entirety of the drift region is depleted by the second depletion region, the applied voltage is applied to the entirety of the drift region. When an electric field intensity in the depletion layer reaches a critical electric field owing to the increase of the applied voltage, the breakdown of the withstand voltage occurs, but forming the semiconductor region makes it possible to deplete the drift region even if the impurity concentration of the drift region is made comparatively large. Therefore, the resistance value of the drift region can be made small while the withstand voltage is kept intact, so that the ON resistance of the relevant transistor can be made small.

There is a technology disclosed in PTL 1 that makes it possible to fabricate conventional LDMOS field-effect transistors in the drift regions of which the buildups of electric fields are suppressed using this RESURF effect. According to PTL 1, as shown in FIG. 7A, an N-type LDMOS field-effect transistor 100 includes: a gate electrode 111; a gate field plate 117; and a P+ buried region 103 disposed below a body region 105 and a part of a drift region 106. Equipotential lines at the time of the transistor being in an OFF state are shown in FIG. 7A.

In addition, in FIG. 7B, the electric field intensity of the channel region and the drift region 106 is shown versus distances in the X direction. For the sake of comparison, electric field intensities in the cases of (1) neither the gate field plate 117 nor the P+ buried region 103 being existent and in the case of (2) the P+ buried region 103 being nonexistent are also shown.

In the case of (1) neither the gate field plate 117 nor the P+ buried region 103 being existent, the electric field builds up at the end of the gate electrode 111, while, in the case of the field plate 117 being formed, an effect for preventing the electric field at the end of the gate electrode 111 from increasing can be obtained. In addition, forming the P+ buried region 103 makes it possible to suppress the electric field intensity below the gate field plate 117, so that a uniform electric field intensity can be obtained throughout the entire length of the drift region. As a result, a high withstand voltage can be obtained.

CITATION LIST

Patent Literature

PTL 1: Japanese Patent Application Laid-Open No. Hei 7-50413

Nonpatent Literature

Non-PTL 1: J. A. Appels, et al., "High voltage thin layer devices" (RESURF devices), 1979 International Electron Devices Meeting, IEEE, 3-5 Dec. 1979

SUMMARY OF INVENTION

Technical Problem

However, in the above PTL 1, in order to further decrease the ON resistance of the transistor, the impurity concentration of the drift region 106 of the transistor is increased, so that the equipotential lines of the drift region 106 move in the direction of the P-type body region 105. As a result, the electric field builds up in the vicinity 120 of the end of the P+ buried region 103, which leads to the decrease of the withstand voltage of the transistor.

Furthermore, as shown in FIG. 8, in the case where the impurity concentration of the P-type substrate 101 is decreased in order to make the withstand voltage independent of the vertical electric fields of a drain region 107 and a P-type substrate 101, the RESURF effect is also decreased. As a result, the electric field builds up in the vicinity 120 of the end of the P+ buried region 103, which leads to the decrease of the withstand voltage of the transistor.

In addition, as shown in FIG. 9, in the case where the structure of the transistor shown in FIG. 8 is formed on an SOI substrate to electrically isolate the P-type semiconductor substrate 101 from a source electrode 115, and the voltage of the P-type semiconductor substrate 101 is made equal to that of a drain electrode 116, a RESURF effect brought about by the substrate (P-type semiconductor substrate 101) is decreased. As a result, the electric field similarly builds up in the vicinity 120 of the end of the P+ buried region 103, which leads to the decrease of the withstand voltage.

Therefore, an object of the present invention is to provide a high withstand voltage LDMOS field-effect transistor that enables the compatibility of the increase of its withstand voltage and the decrease of its ON resistance.

To put it concretely, the object is to keep the high withstand voltage of a transistor with its withstand voltage 100 V or larger intact, even in the case where the impurity concentration of the drift region of the transistor is equal to $1e16/cm^3$ or larger and more than an order of magnitude larger than the impurity concentrations of the P-type epitaxial layer and the P-type substrate of the transistor and a RESURF effect becomes small, by suppressing the buildup of the electric field in the vicinity of the P+ buried region of the transistor and making the electric field intensities of the drift region uniform.

Furthermore, another object is to keep the high withstand voltage of a transistor with its withstand voltage 100 V or larger intact, even in the case where the potential of the substrate of the transistor is not equal to the potential of the source of the transistor and a RESURF effect brought about by the substrate is decreased or vanished, by suppressing the buildup of the electric field in the vicinity of the P+ buried region of the transistor.

Solution to Problem

In order to solve the above problem, the present invention provides a semiconductor device including: a first electroconductive type body region formed on a main surface of a semiconductor substrate; a second electroconductive type source region formed on a surface of the body region; a second electroconductive type drift region formed so as to have contact with the body region; a second electroconductive type drain region formed on the drift region; a first electroconductive type buried region having contact with the body region and formed under the drift region; a gate electrode formed above the body region between the source region and the drift region and above the drift region nearer to the source region via a gate insulating film; a first field plate that extends from the gate electrode toward the drain region and that is formed above the drift region via a first insulating film; and a second field plate that has contact with the source region or the gate electrode and is formed above the first field plate via a second insulating film, in which a distance between the buried region and the drain region is shorter than a distance between the first field plate and the drain region and longer than a distance between the second field plate and the drain region.

In addition, the present invention provides a semiconductor device including: a first electroconductive type body region formed on a main surface of a semiconductor substrate; a second electroconductive type emitter region formed on a surface of the body region; a second electroconductive type drift region formed so as to have contact with the body region; a first electroconductive type collector region formed on the drift region; a first electroconductive type buried region having contact with the body region and formed below the drift region; a gate electrode formed above the body region between the emitter region and the drift region and above the drift region nearer to the emitter region via a gate insulating film; a first field plate that extends from the gate electrode toward the drain region and that is formed above the drift region via a first insulating film; and a second field plate that has contact with the emitter region or the gate electrode and that is formed above the first field plate via a second insulating film, in which a distance between the buried region and the collector region is shorter than a distance between the first field plate and the collector region and longer than a distance between the second field plate and the collector region.

Advantageous Effects of Invention

According to the present invention, a high withstand voltage LDMOS field-effect transistor that enables the compatibility of the increase of its withstand voltage and the decrease of its ON resistance can be realized.

Problems, configurations, and advantageous effects other than the above will be explicitly shown by the descriptions of the following embodiments.

BRIEF DESCRIPTION OF DRAWINGS

FIG. 2A is a diagram showing an impurity concentration distribution taken along the dashed line A-A' of the semiconductor device in FIG. 1.

DESCRIPTION OF EMBODIMENTS

Hereinafter, examples of the present invention will be described with reference to the accompanying drawings. Here, in the following drawings, the same components are given the same reference signs, and detailed explanations about redundant parts will be omitted in some cases.

EXAMPLE 1

A semiconductor device according to a first embodiment of the present invention will be explained with reference to FIG. 1 through FIG. 3.

Figure 1:
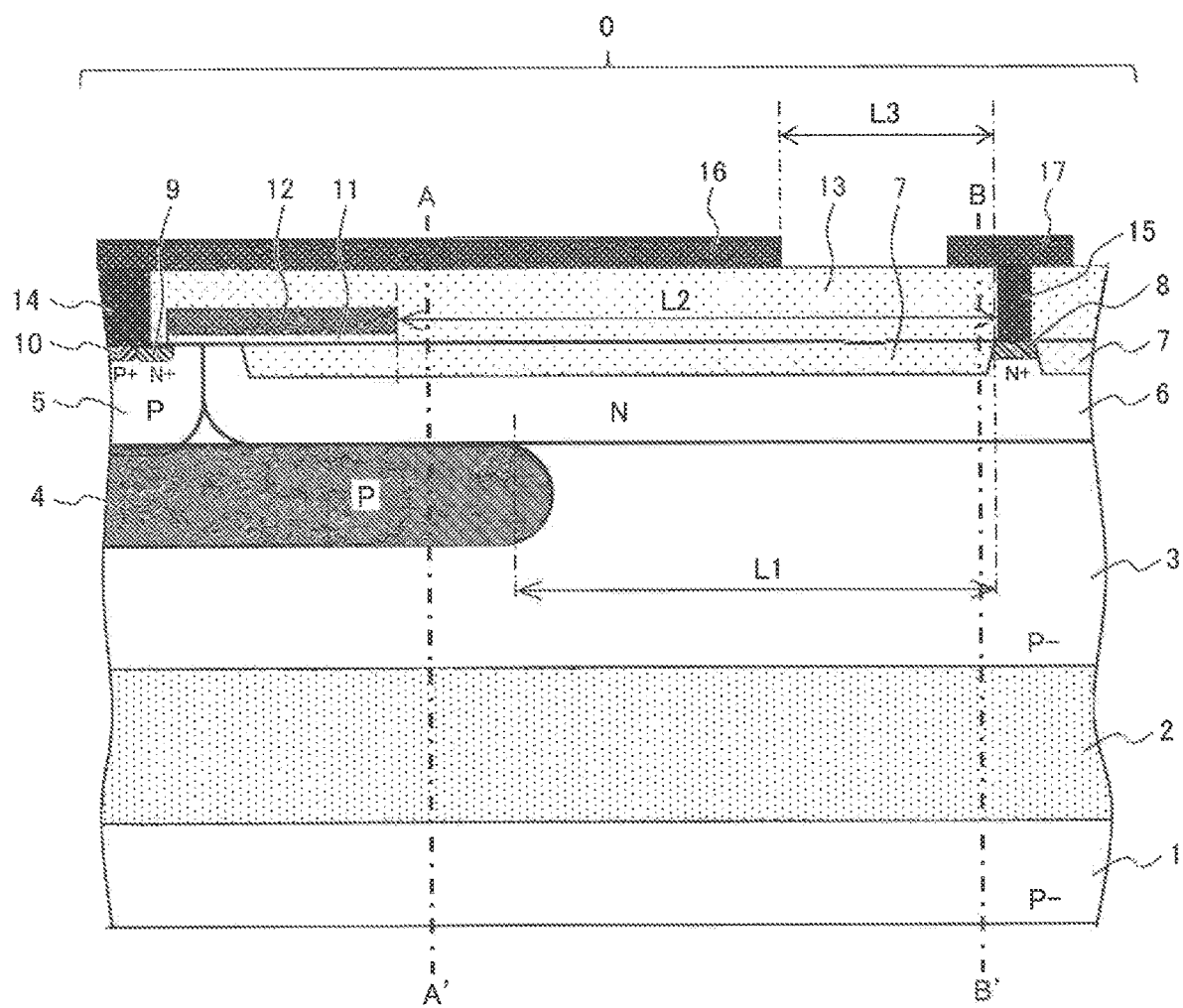
FIG. 1 is a diagram showing a cross-sectional structure of a semiconductor device according to a first embodiment of the present invention.

As shown in FIG. 1, the semiconductor device according to this example is an N-type LDMOS field-effect transistor 0, which is formed on an SOI substrate that includes an SOI layer 3, an insulating layer 2, and a P-type semiconductor substrate 1, in which the SOI layer 3 is formed on the insulating layer 2, and the insulating layer 2 is formed on the P-type semiconductor substrate 1. A P-type buried region 4 is formed on the SOI substrate, and while being connected to a P-type body region 5, the P-type buried region 4 is formed under a part of an N-type drift region 6 formed next to the P-type body region 5.

Furthermore, a gate electrode 12 is formed above a part of the P-type body region 5 and a part of the N-type drift region 6 nearer to a source region 9 (on the left of FIG. 1) via a gate oxide film 11, and the gate electrode 12 extends above an insulating layer 7 on the N-type drift region 6 to form a first field plate.

In addition, the N-type source region 9 is formed on the P-type body region 5 so as to have contact with the gate oxide film 11, and a P-type region 10, which is a feeding region for the P-type body region 5, is formed so as to lie next to the N-type source region 9. The N-type source region 9 and the P-type (feeding) region 10 are connected to a wiring layer 16 via a contact 14 to form a source electrode and a second field plate (wiring layer 16).

On the other hand, a drain region 8 is formed on the N-type drift region 6, and the drain region 8 is connected to a wiring layer 17 via a contact 15 to form a drain electrode (wiring layer 17). In other words, the N-type drift region 6 is formed between the P-type body region 5 and the N-type drain region 8 so as to extend along the main surface of the semiconductor substrate 1.

Here, let L1 be a distance between the P-type buried region 4 and the N-type drain region 8 along the surface of the semiconductor substrate 1. Furthermore, let L2 be a distance between the first field plate (gate electrode 12) and the N-type drain region 8 along the surface of the semiconductor substrate 1, and let L3 be a distance between the second field plate (wiring layer 16) and the N-type drain region 8 along the surface of the semiconductor substrate 1. Then Equation (1) holds among L1, L2, and L3.

[Equation 1]

$$L3<L1<L2 \quad (1)$$

Figure 2B:
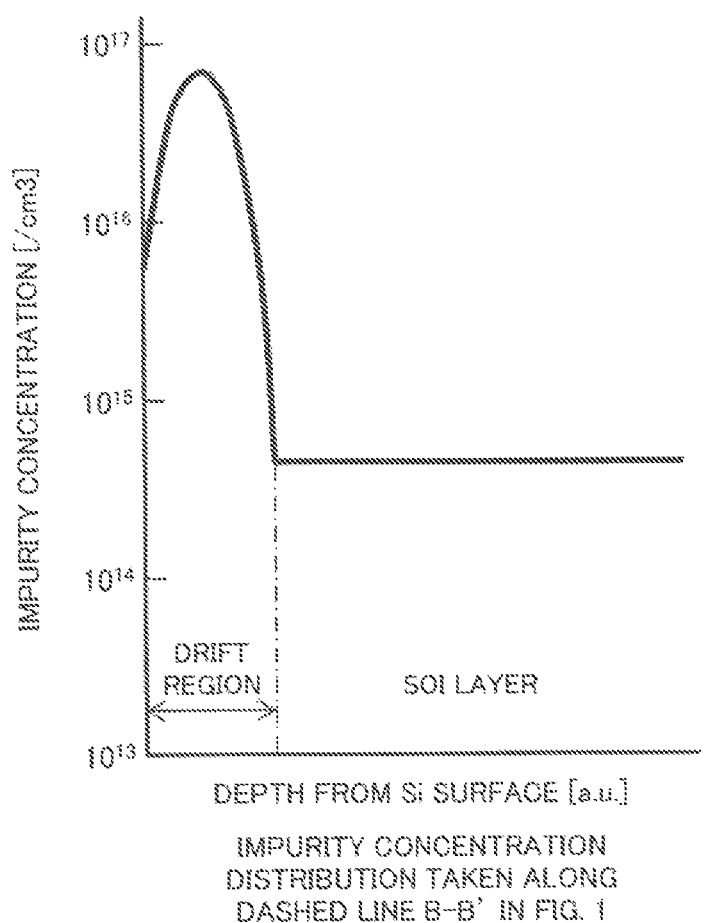
FIG. 2B is a diagram showing an impurity concentration distribution taken along the dashed line B-B' of the semiconductor device in FIG. 1.
Figure 3:
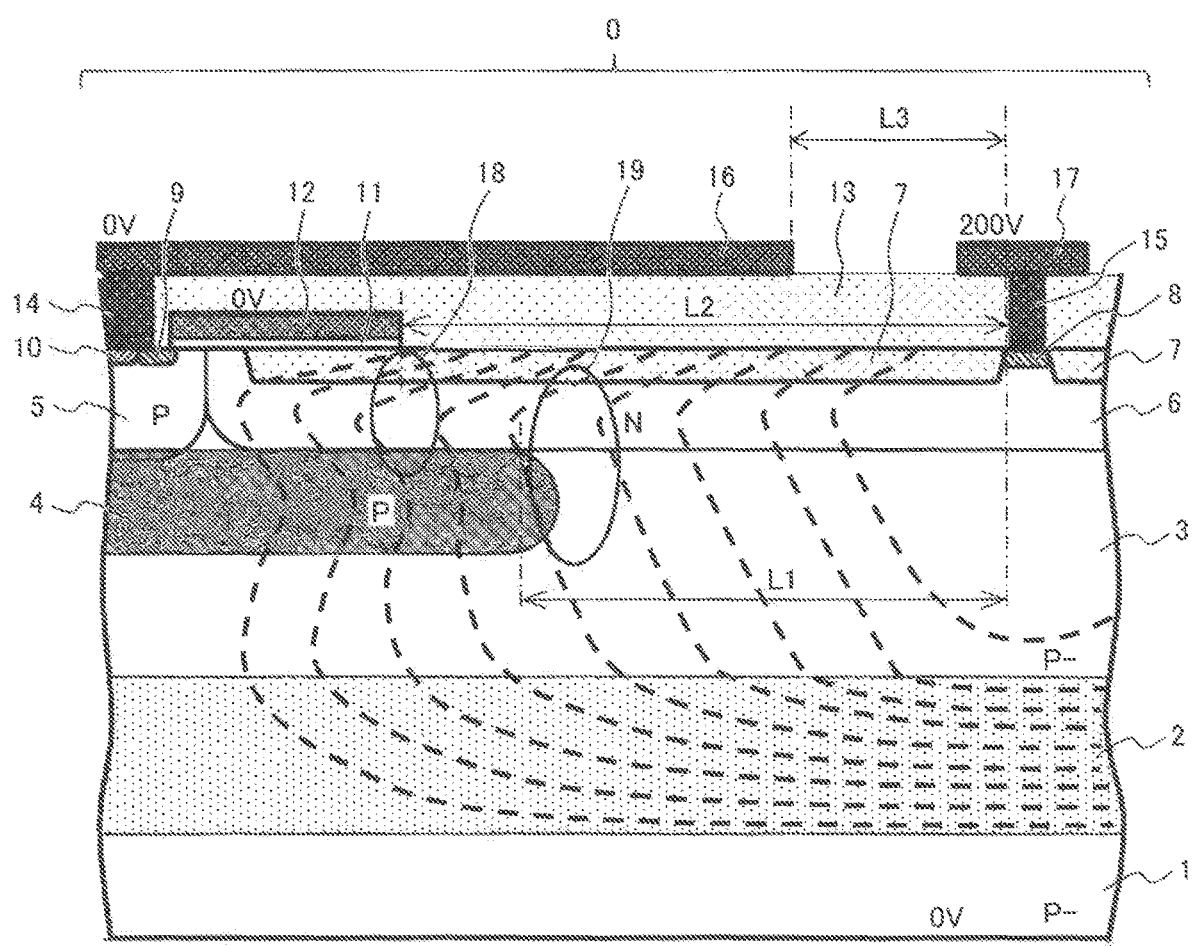
FIG. 3 is a diagram showing an equipotential line distribution in the case where voltages are applied to the substrate and the electrodes of the semiconductor device in FIG. 1 respectively.

Next, impurity concentrations in the depth directions of the semiconductor layer taken along the dashed line A-A' and the dashed line B-B' are shown in FIGS. 2A and 2B respectively. As shown in FIG. 2A, it is desirable that the maximum impurity concentration of the P-type buried region 4 should be in the range of 1 to ⅓ of the maximum impurity concentration of the N-type drift region 6. This is because the object of the above setting is to effectively form a depletion layer in the N-type drift region 6 owing to electric fields from the first field plate 12 and the second field plate 16 and owing to the P-type buried region 4, to prevent an electric field in a region 18 in the vicinity of the P-type buried region 4 from building up, and to form a depletion layer in the P-type buried region 4 as well when a voltage (200 V) is applied between the source electrode 16 and the drain electrode 17 at the time of the transistor being in an OFF state as shown in FIG. 3 (the potential of the substrate is 0 V).

In addition, as shown by the impurity concentration in the depth direction of the semiconductor layer taken along the line B-B' (in FIG. 2B), it is necessary that the impurity concentration of the SOI layer under the N-type drift region 6 should be sufficiently small compared with the impurity concentration of the N-type drift region 6 so that a depletion layer is expanded in the depth direction from the N-type drain region 8 when a voltage is applied to the drain electrode 17. A relationship between a withstand voltage (BV(V)) at an N+/P junction and the impurity concentration ($N_A$(cm$^{-3}$)) of the P-type semiconductor layer can be induced from the Poisson's equation, and the withstand voltage is given by Equation (2).

[Equation 2]

$$BV=5.2\times10^{13}N_A^{-3/4} \quad (2)$$

Using this Equation, a withstand voltage (BV) at the time of $N_A$=3.0e15/cm³ proves to be 128 V. Therefore, the impurity concentration of an SOI layer included in a transistor to which the present invention gives consideration and that has its element withstand voltage equal to 100 V or larger is equal to 3.0e15/cm³ or smaller.

On the other hand, by making Equation (1) hold in a relationship among L1, L2, and L3, the electric field in the vicinity 18 of the end of the first field plate 12 is prevented from building up owing to the P-type buried region 4, and at the same time, it is possible to prevent an electric field in the vicinity 19 of the end of the P-type buried region 4 from building up owing to the second field plate 16.

As described above, the N-type LDMOS field-effect transistor 0, which is the semiconductor device according to this example, is configured to include: the first electroconductive type body region 5 formed on the main surface of the semiconductor substrate 1; the second electroconductive type source region (N-type source region 9) formed on the surface of the body region 5; the second electroconductive type drift region (N-type drift region 6) formed so as to have contact with the body region 5; the second electroconductive type drain region (N-type drain region 8) formed on the drift region (N-type drift region 6); the first electroconductive type buried region (P-type buried region 4) having contact with the body region 5 and being formed below the drift region (N-type drift region 6); the gate electrode 12 formed above the body region 5 between the source region (N-type source region 9) and the drift region (N-type drift region 6) and above the drift region (N-type drift region 6) nearer to the source region (N-type source region 9) via the gate insulating film (gate oxide film 11); the first field plate 12 that extends from the gate electrode 12 toward the drain region (N-type drain region 8) and that is formed above the drift region (N-type drift region 6) via the first insulating film (insulating layer 7); and the second field plate 16 that has contact with the source region (N-type source region 9) or the gate electrode 12 and that is formed above the first field plate 12 via the second insulating film (insulating layer 13), in which the distance (L1) between the buried region (P-type buried region 4) and the drain region (N-type drain region 8) is shorter than the distance (L2) between the first field plate 12 and the drain region (N-type drain region 8) and longer than the distance (L3) between the second field plate 16 and the drain region (N-type drain region 8).

Furthermore, the N-type LDMOS field-effect transistor is configured in such a way that the maximum impurity concentration of the drift region (N-type drift region 6) is equal to 1e16/cm3 or larger in order to expand the depletion layer, and the maximum impurity concentration of the buried region (P-type buried region 4) is equal to one third of the maximum impurity concentration of the drift region (N-type drift region 6) on the buried region (P-type buried region 4) or larger or equal to the maximum impurity concentration of the drift region or smaller.

Herewith, although the impurity concentration in the N-type drift region 6 is set equal to 1e16/cm$^3$ or larger, the electric fields in the N-type drift region 6 and the P-type buried region 4 can be prevented from building up, which enables the compatibility of the increase of the withstand voltage and the decrease of the ON resistance.

In addition, although the second field plate 16 is electrically connected to the N-type source region 9 (body region 5) in this example, even in the case where the second field plate 16 is electrically connected to the gate electrode and the first field plate 12, a similar advantageous effect can be obtained.

Furthermore, although the N-type MOS transistor is taken as an example in this example, a similar advantageous effect can be obtained even if a P-type MOS transistor is taken as an example.

In addition, even in the case where an IGBT structure is adopted by fabricating a PN junction structure in the N-type drain region 8 of the N-type MOS transistor, it is possible to realize the decrease of the element size and the increase of the withstand voltage in the N-type MOS transistor by preventing an electric field in the drift region from building up. In this case, in the structure shown in FIG. 1. the N-type source region 9 is replaced with an "emitter region" and the N-type drain region 8 is replaced with a "collector region".

EXAMPLE 2

A semiconductor device according to Example 2 of the present invention will be explained with reference to FIG. 4.

Figure 4:
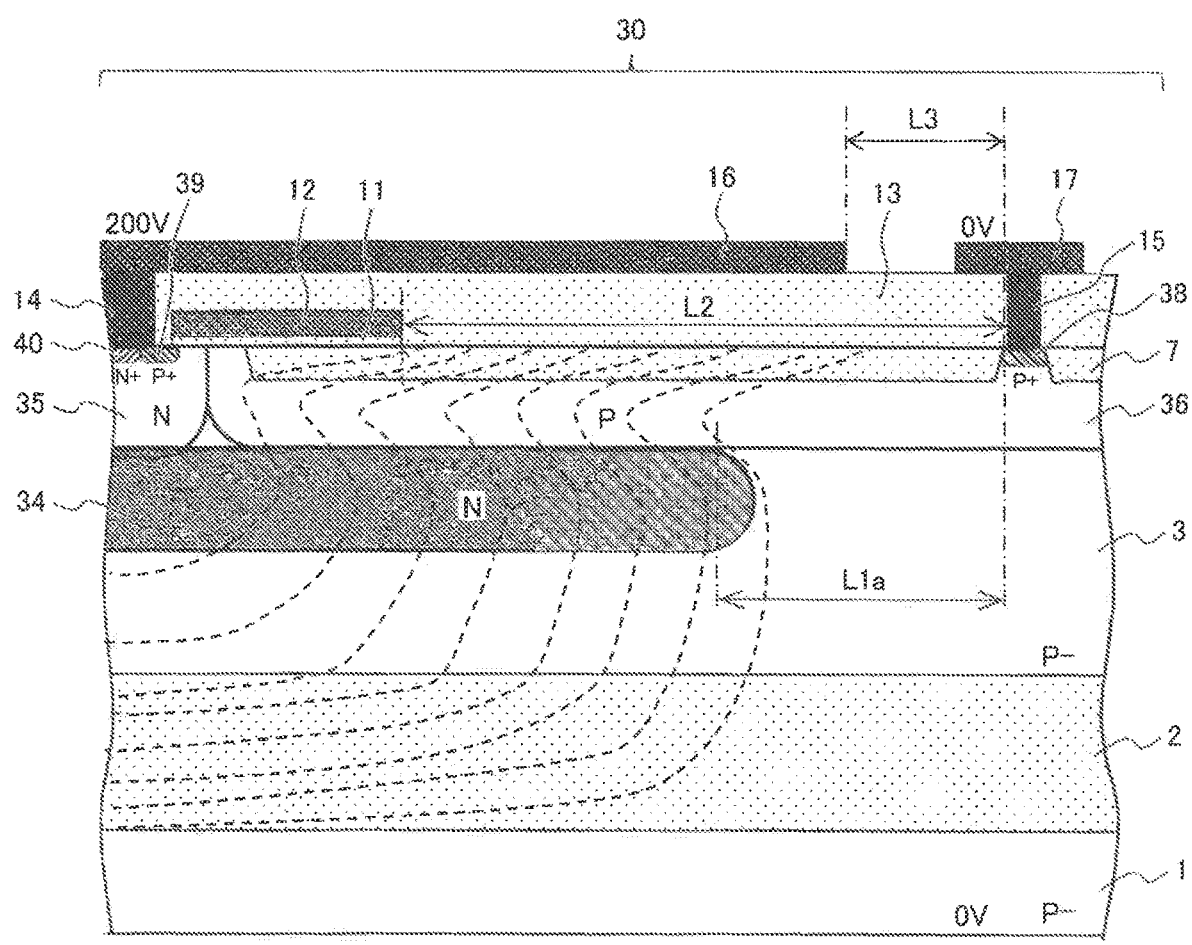
FIG. 4 is a diagram showing a cross-sectional structure of a semiconductor device according to a second embodiment of the present invention and an equipotential line distribution in the case where voltages are applied to the electrodes respectively.

The semiconductor device according to this example is, as shown in FIG. 4, a P-type LDMOS field-effect transistor 30, and its SOI substrate includes an insulating layer 2 formed on a P-type semiconductor substrate 1 and a P-type semiconductor layer (SOI layer) 3 formed on the insulating layer 2 in a similar way to FIG. 1. This P-type LDMOS field-effect transistor 30 is different from the N-type MOS transistor 0 shown in FIG. 1 in that all the polarities of an N-type buried region 34, an N-type body region 35, a P-type drift region 36, a P-type drain region 38, a P-type source region 39, and an N-type (feeding) region 40 of the N-type body region 35 are opposite.

Furthermore, FIG. 4 shows equipotential lines in the case where a voltage 200 V is applied between a source electrode 16 and a drain electrode 17 (the potential of the substrate is 0 V). Being different from the potential of the substrate of the N-type MOS transistor shown m FIG. 3, the potential of the substrate of this P-type LDMOS field-effect transistor 30 is equal to the potential of the drain potential, so that there is no RESURF effect brought about by the SOI substrate for the P-type drift region 36, and equipotential lines in the P-type drift region 36 gather nearer to the N-type body region 35, which leads to the building-up of an electric field in this region.

In order to prevent this building-up of the electric field, a distance L1a between the N-type buried region 34 and the P-type drain region 38 in FIG. 4 is set smaller than the distance L1 between the P-type buried region 4 and the N-type drain region 8 in FIG. 1, and the distance L1a is set closer to a distance L3 between a second field plate 16 and the P-type drain region 38. Herewith, a RESURF effect brought about by the N-type buried region 34 for the P-type drift region 36 is increased, and at the same time, influence on the equipotential lines brought about the SOI substrate can be decreased.

In addition, let L1a be a distance between the N-type buried region 34 and the P-type drain region 38 along the surface of the semiconductor substrate 1, let L2 be a distance between the first field plate 12 and the P-type drain region 38 along the surface of the semiconductor substrate 1, and let L3 be a distance between the second field plate 16 and the P-type drain region 38 along the surface of the semiconductor substrate 1. In this case, because there is a relationship L3<L1a<L2, electric fields in the vicinity of the end of the first field plate 12 (a region corresponding to the region with the reference sign 18 in FIG. 3) and in the vicinity of the end of the N-type buried region 34 (a region corresponding to the region with the reference sign 19 in FIG. 3) can be prevented from building up, in a similar way to FIG. 1. Therefore, even in the case where there is no RESURF effect brought about by the SOI substrate, the high withstand voltage of the element can be kept intact.

EXAMPLE 3

A semiconductor device according to Example 3 of the present invention will be explained with reference to FIG. 5.

Figure 5:
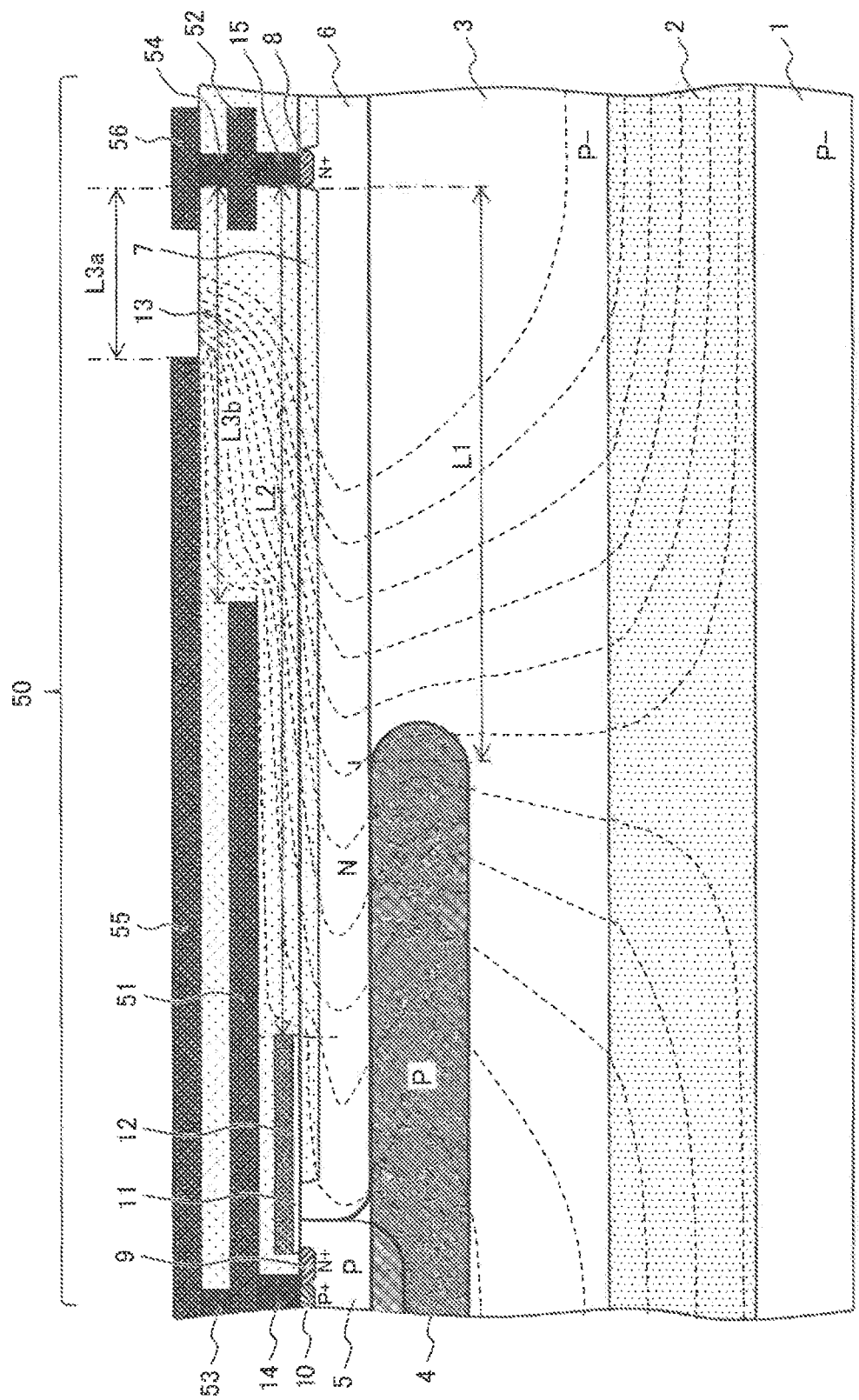
FIG. 5 is a diagram showing a cross-sectional structure of a semiconductor device according to a third embodiment of the present invention and an equipotential line distribution in the case where voltages are applied to the electrodes respectively.

The semiconductor device according to this example is, as shown in FIG. 5, an N-type LDMOS field-effect transistor 50, and different from Example 1 (N-type MOS transistor 0 in FIG. 1) in that a second field plate is composed of plural wiring layers.

A contact 14 connected to an N-type source region 9 and a P-type (feeding) region 10 of a P-type body region 5 is connected to a second field plate 51 composed of a first wiring layer. Furthermore, a contact 53 connected to the second field plate 51 is connected to a second field plate 55 composed of a second wiring layer.

Here, let L1 be a distance between a P-type buried region 4 and an N-type drain region 8 along the surface of a semiconductor substrate 1, let L2 be a distance between a first field plate 12 and an N-type drain region 8 along the surface of the semiconductor substrate 1, let L3b be a distance between the second field plate 51 composed of the first wiring layer and the N-type drain region 8 along the surface of the semiconductor substrate 1, and let L3a be a distance between the second field plate 55 composed of the second wiring layer and the N-type drain region 8 along the surface of the semiconductor substrate 1. Then Equation (3) and Equation (4) hold among L1, L2, L3a, and L3b.

[Equation 3]

$$L3a<L1<L2 \quad (3)$$

[Equation 4]

$$L3a<L3b \quad (4)$$

FIG. 5 shows an equipotential distribution in the case where a voltage of 400 V is applied between the N-type source region 9 and the N-type drain region 8 and the potential of the P-type substrate 1 is set to be a voltage of 200 V, which is half of the voltage of 400 V. In this case, because the second field plate is composed of the plural wiring layers 51 and 55, an electric field distribution in the N-type drift region 6, which has a uniform impurity concentration along the surface of the semiconductor substrate 1, can be made more uniform than in the case where the second field plate is composed of a single layer.

As described above, in the N-type LDMOS field-effect transistor 50 that is the semiconductor device according to this example, the second field plate is composed of the plural wiring layers 51 and 55 that have distances to the drain region (N-type drain region 8) different from each other, and the plural wiring layers 51 and 55 are configured in such a way that the distance (L3a) between the wiring layer 55, which is located in an upper layer, and the drain region (IN-type drain region 8) is shorter than the distance (L3b) between the wiring layer 51, which is located in a lower layer, and the drain region (N-type drain region 8), the distance (L3a) between the wiring layer 55, which is located in the uppermost layer, and the drain region (N-type drain region 8) is shorter than the distance (L1) between the buried region (P-type buried region 4) and the drain region (N-type drain region 8), and the distance (L3b) between the wiring layer 51, which is located in the lowermost layer, and the drain region (N-type drain region 8) is shorter than the distance (L2) between the first field plate 12 and the drain region (N-type drain region 8).

As a result, at the time of being in an OFF state, the electric field in the N-type drift region 6 is prevented from building up and the electric field can be made uniform in a more expanded range, so that a characteristic of a higher withstand voltage and a low ON resistance can be obtained.

EXAMPLE 4

A semiconductor device according to Example 4 of the present invention will be explained with reference to FIG. 6. In this example, an example in which the present invention is applied to a diode will be explained.

Figure 6:
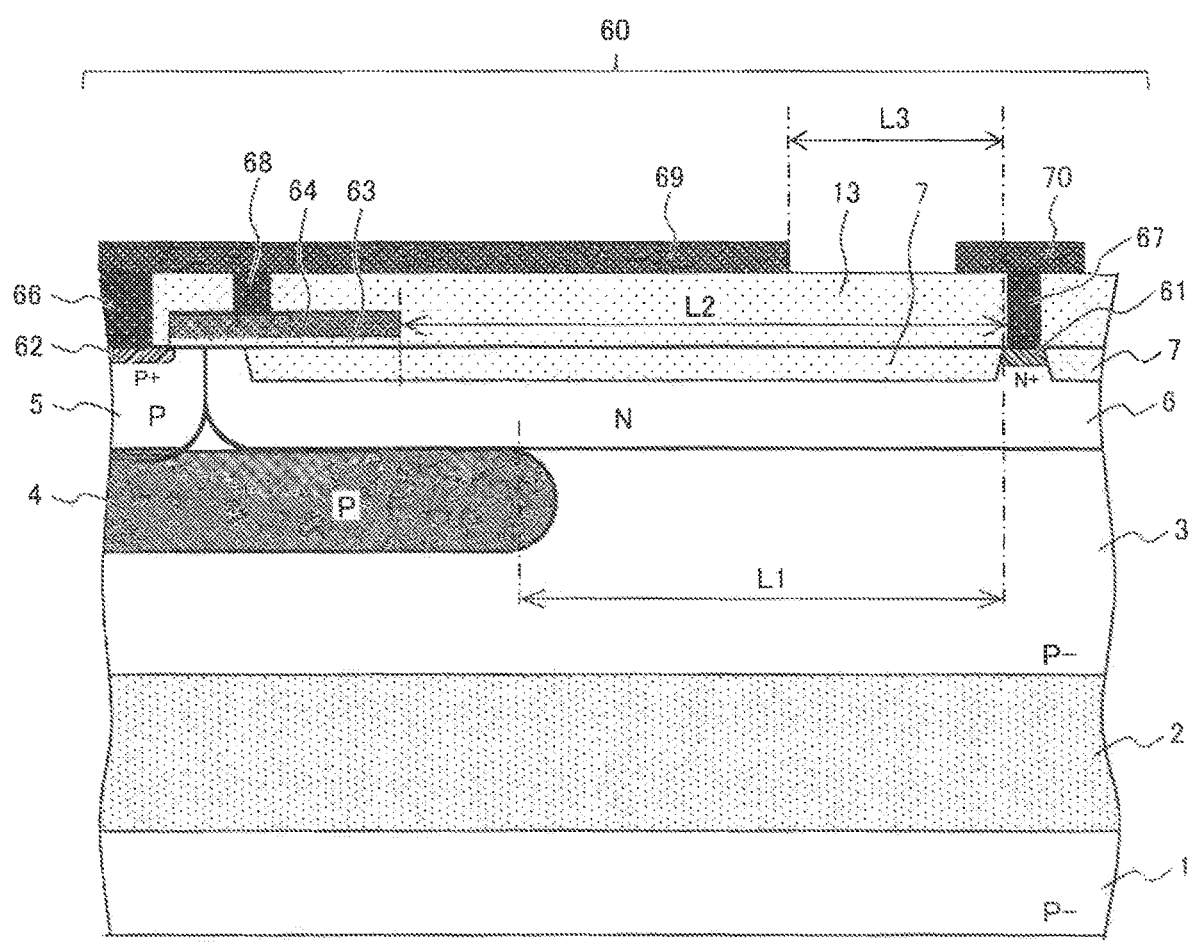
FIG. 6 is a diagram showing a cross-sectional structure of a semiconductor device according to a fourth embodiment of the present invention.
Figure 7A:
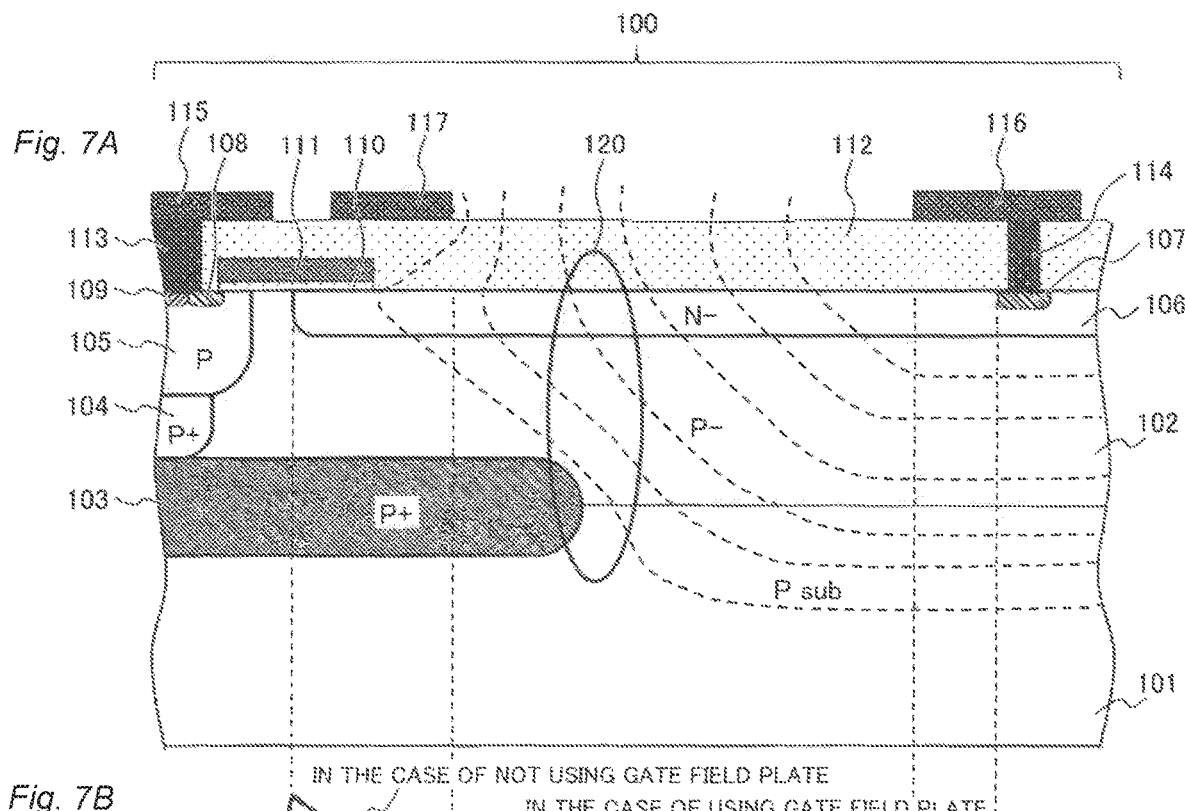
FIGS. 7A and 7B are diagrams showing a cross-sectional structure of a conventional semiconductor device, an equipotential line distribution in the case where voltages are applied to the electrodes of the semiconductor device respectively, and electric field intensity distributions of the draft region versus distances along the surface.
Figure 7B:
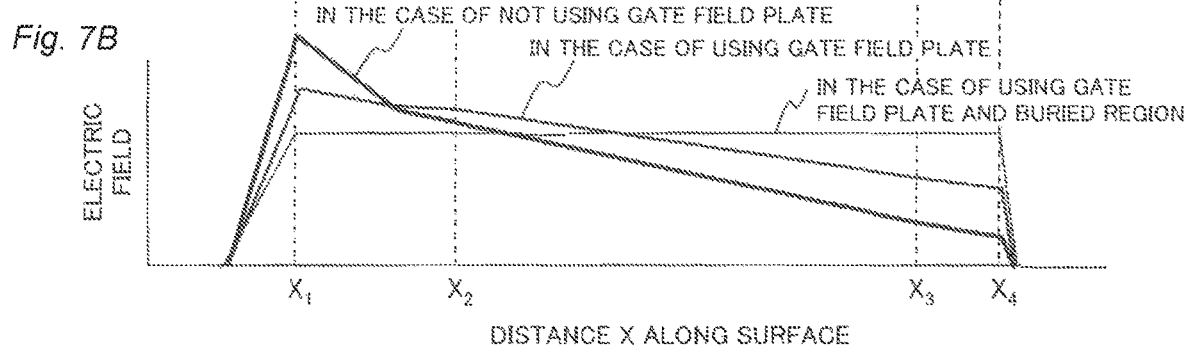
Figure 8:
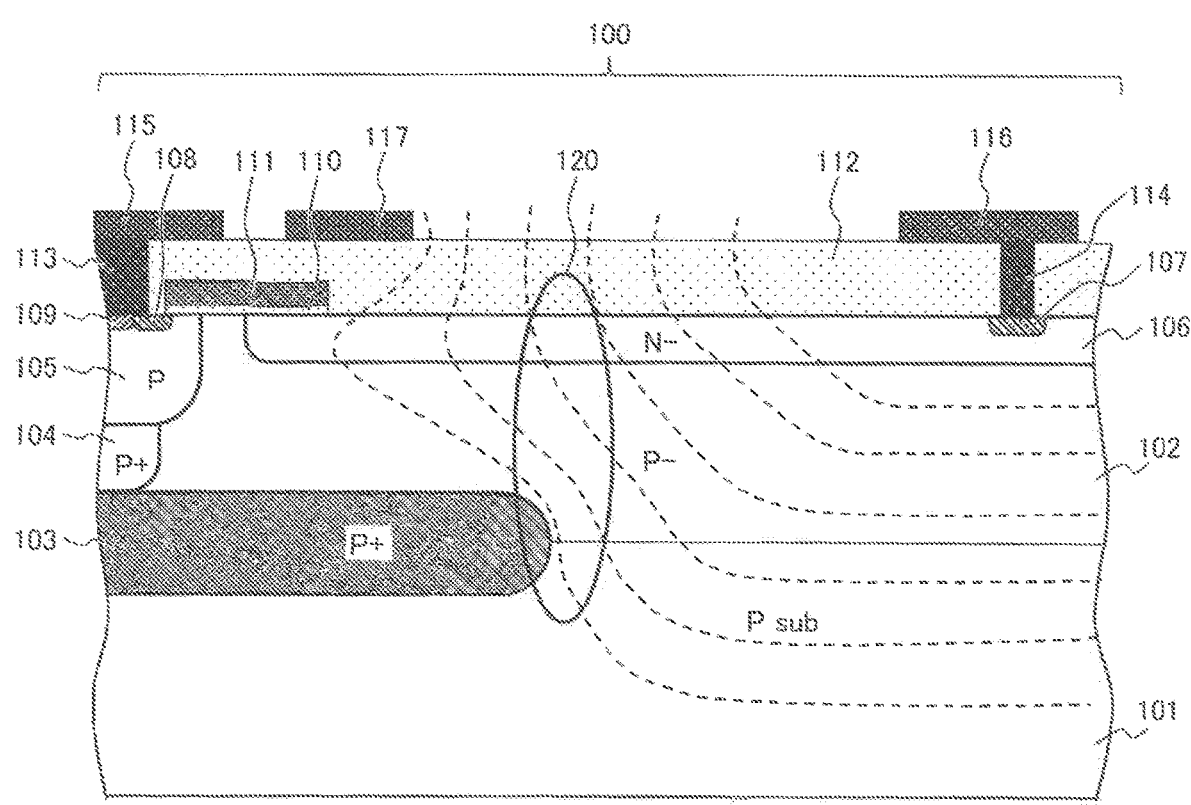
FIG. 8 is a diagram showing the cross-sectional structure of a conventional semiconductor device and an equipotential line distribution in the case where voltages are applied to the electrodes respectively.
Figure 9:
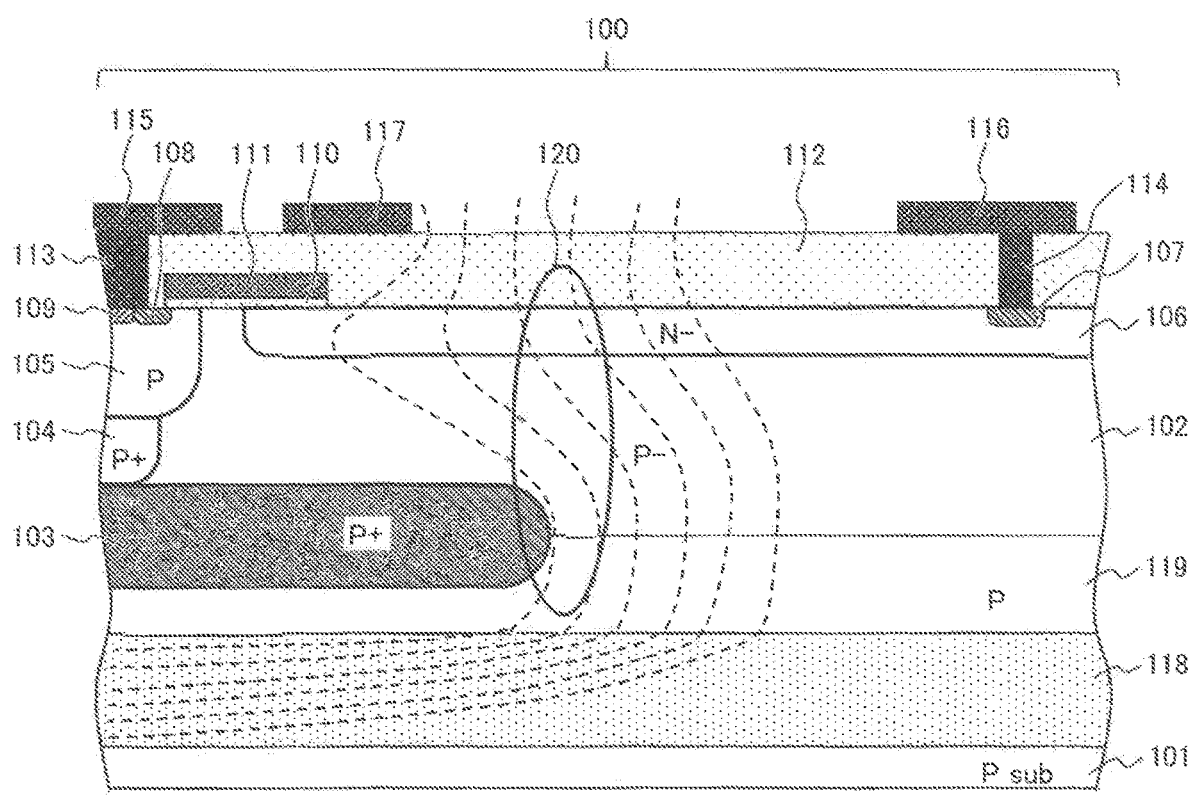
FIG. 9 is a diagram showing a cross-sectional structure of a conventional semiconductor device and an equipotential line distribution in the case where voltages are applied to the electrodes respectively.

As shown in FIG. 6, a semiconductor device according to this example is a diode 60, in which an N-type cathode region 61 is formed on an N-type drift region 6 and a P-type anode region 62 is formed on a P-type body region 5. A first field plate 64, which is composed of polysilicon, is formed on an oxide film 63 that is formed above a part of the P-type body region 5 and a part of the N-type drift region 6 so as to have contact with the P-type anode region 62.

The P-type anode region 62 is connected to an anode electrode and a second field plate 69 via an anode region lead contact 66. In addition, the first field plate 64 and the second field plate 69 are connected to each other via a connection contact 68. The first field plate (and gate electrode) 64 is electrically connected to the P-type body region 5 via the second field plate 69.

Here, let L1 be a distance between a P-type buried region 4 and the N-type cathode region 61 along the surface of a semiconductor substrate 1. Furthermore, let L2 be a distance between the first field plate 64 and the N-type cathode region 61 along the surface of the semiconductor substrate 1, and let L3 be a distance between the second field plate 69 and the N-type cathode region 61 along the surface of the semiconductor. Then, as is the case with Example 1 (FIG. 1), the abovementioned Equation (1) holds among L1, L2, and L3.

Herewith, an electric field in the vicinity of the end of the first field plate 64 is prevented from building up owing to the P-type buried region 4, and at the same time, it is possible to prevent an electric field in the vicinity of the end of the P-type buried region 4 from building up owing to the second field plate 69.

As a result, even in the case where the impurity concentration of the N-type drift region 6 is equal to $1e16/cm^3$ or larger, the high withstand voltage can be kept intact and the element can be downsized.

Furthermore, because the recovery time of the diode 60 can be shortened by increasing the impurity concentration of the N-type drift region 6, the recovery loss of the diode 60 can be decreased, and at the same time, the decrease of a forward current owing to a high-impurity injection effect can be suppressed.

As described above, according to the respective examples of the present invention, even in the case where the impurity concentration of the drift region is equal to $1e16/cm^3$ or larger and more than an order of magnitude larger than the impurity concentrations of the P-type epitaxial layer under the drift region and the P-type substrate of the transistor (P-type SOI layer 3 or the P-type semiconductor substrate 1 in the case of the bulk Si substrate being used) and the RESURF effect becomes small, it is possible to make the electric field intensities in the drift region uniform by suppressing the buildup of the electric field in the vicinity of the P-type buried region (or the N-type buried region), so that the ON resistance can be decreased while the high withstand voltage is kept intact.

In addition, even in the case where the potential of the substrate is different from the potential of the source (not equal to the potential) and the RESURF effect brought about by the substrate is decreased or vanished, it is possible to suppress the buildup of the electric field in the vicinity of the P-type buried region (or the N-type buried region) and make the electric field in the drift region uniform. Therefore, it is possible to keep the high withstand voltage intact without decreasing the impurity concentration of the drift region, in other words, without increasing the ON resistance.

Note that the present invention is not limited to the abovementioned examples, and the present invention may include various kinds of modifications. For example, the above examples have been described in detail in order to explain the present invention in an easily understood manner, and the present invention is not necessarily limited to examples including all the configurations that have been described so far. In addition, a part of the configuration of one example can be replaced with the configuration of another example, or the configuration of one example may be added to the configuration of another example. Furthermore, another configuration may be added to a part of the configuration of each example, a part of the configuration may be deleted from each example, or a part of the configuration of each example may be replaced with another configuration.

The invention claimed is:
1. A semiconductor device comprising:
   a first electroconductive type body region formed on a main surface of a semiconductor substrate;
   a second electroconductive type source region formed on a surface of the body region;
   a second electroconductive type drift region formed so as to have contact with the body region;
   a second electroconductive type drain region formed on the drift region;
   a first electroconductive type buried region having contact with the body region and formed below the drift region;
   a gate electrode formed above the body region between the source region and the drift region and above the drift region nearer to the source region via a gate insulating film;

a first field plate that extends from the gate electrode toward the drain region and that is formed above the drift region via a first insulating film, a bottom surface of the first insulating film being lower than a top surface of the second electroconductive type drift region; and a second field plate that has contact with the source region or the gate electrode and that is formed above the first field plate via a second insulating film, wherein a distance between the buried region and the drain region is shorter than a distance between the first field plate and the drain region, and longer than a distance between the second field plate and the drain region, wherein the semiconductor substrate has a first electroconductive type SOI layer formed with a buried insulating layer therebetween, and the first electroconductive type SOI layer separates the buried insulating layer from the first electroconductive type buried region and the second electroconductive type drift region.

2. The semiconductor device according to claim 1,
wherein the second field plate is composed of a plurality of wiring layers which have distances to the drain region different from one another;
a distance between any upper layer and the drain region is shorter than a distance between any lower layer and the drain region in the plurality of wiring layers;
a distance between a wiring layer, which is located in the uppermost layer, and the drain region is shorter than a distance between the buried region and the drain region; and
a distance between a wiring layer, which is located in the lowermost layer, and the drain region is shorter than a distance between the first field plate and the drain region.

3. The semiconductor device according to claim 1,
wherein the maximum impurity concentration of the drift region is equal to 1e16/cm³ or larger, and
the maximum impurity concentration of the buried region is equal to one third of the maximum impurity concentration of the drift region on the buried region or larger or equal to the maximum impurity concentration of the drift region or smaller.

4. The semiconductor device according to claim 1, wherein
the body region, the source region, the drift region, the drain region, and the buried region are formed in the SOI layer.

5. The semiconductor device according to claim 1,
wherein the gate electrode and the first field plate are electrically connected to the body region.

6. The semiconductor device according to claim 1, the semiconductor device being an LDMOS,
wherein the drift region extends along the main surface of the semiconductor substrate between the body region and the drain region.

7. The semiconductor device according to claim 1,
wherein a voltage of the semiconductor substrate is equal to the voltage of the drain region.

8. The semiconductor device according to claim 1,
wherein a voltage of the semiconductor substrate is equal to a voltage intermediate between the voltage of the drain region and the voltage of the source region.

9. A semiconductor device comprising:
a first electroconductive type body region formed on a main surface of a semiconductor substrate;
a second electroconductive type emitter region formed on a surface of the body region;
a second electroconductive type drift region formed so as to have contact with the body region;
a first electroconductive type collector region formed on the drift region;
a first electroconductive type buried region having contact with the body region and formed below the drift region, a top surface of the first electroconductive type buried region being leveled with a bottom surface of the second electroconductive type drift region;
a gate electrode formed above the body region between the emitter region and the drift region and above the drift region nearer to the emitter region via a gate insulating film;
a first field plate that extends from the gate electrode toward the collector region and that is formed above the drift region via a first insulating film, a bottom surface of the first insulating film being lower than a top surface of the second electroconductive type drift region; and
a second field plate that has contact with the emitter region or the gate electrode and that is formed above the first field plate via a second insulating film,
wherein a distance between the buried region and the collector region is shorter than a distance between the first field plate and the collector region and longer than a distance between the second field plate and the collector region.

10. The semiconductor device according to claim 9,
wherein the semiconductor substrate has an SOI layer formed with a buried insulating layer therebetween, and
the body region, the emitter region, the drift region, the collector region, and the buried region are formed in the SOI layer.

* * * * *